(12) United States Patent
Khayatzadeh et al.

(10) Patent No.: US 10,056,121 B2
(45) Date of Patent: Aug. 21, 2018

(54) INTEGRATED CIRCUIT USING TOPOLOGY CONFIGURATIONS

(71) Applicants: ARM Limited, Cambridge (GB); The Regents of the University of Michigan, Ann Arbor, MI (US)

(72) Inventors: Mahmood Khayatzadeh, Mountain View, CA (US); Massimo Bruno Alioto, Singapore (SG); David Theodore Blaauw, Ann Arbor, MI (US); Dennis Michael Chen Sylvester, Ann Arbor, MI (US); Fakhruddin Ali Bohra, Austin, TX (US)

(73) Assignees: ARM Limited, Cambridge (GB); The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 15/451,089

(22) Filed: Mar. 6, 2017

(65) Prior Publication Data
US 2017/0178700 A1 Jun. 22, 2017

Related U.S. Application Data

(62) Division of application No. 14/659,270, filed on Mar. 16, 2015, now Pat. No. 9,589,601.

(51) Int. Cl.
*G11C 7/00* (2006.01)
*G11C 7/06* (2006.01)
*G11C 7/10* (2006.01)

(52) U.S. Cl.
CPC ............ *G11C 7/065* (2013.01); *G11C 7/1012* (2013.01)

(58) Field of Classification Search
CPC ....................................................... G11C 7/00
(Continued)

(56) References Cited

U.S. PATENT DOCUMENTS

| 5,455,798 A | 10/1995 | McClure |
| 6,034,908 A | 3/2000 | Becker et al. |

(Continued)

OTHER PUBLICATIONS

Ariannejad, et al.; Design of an 8-cell Dual Port SRAM in 0.18-μm CMOS Technology; Research Journal of Applied Sciences, Engineering and Technology; vol. 5, Issue 8, pp. 2565-2568; Mar. 15, 2013.

(Continued)

*Primary Examiner* — Harry W Byrne
(74) *Attorney, Agent, or Firm* — Pramudji Law Group PLLC; Ari Pramudji

(57) ABSTRACT

Various implementations described herein may refer to and may be directed to circuitry for an integrated circuit using topology configurations. For instance, in one implementation, such circuitry may include a memory array having a plurality of memory cells. Such circuitry may also include one or more reconfigurable sense amplifier devices coupled to the memory array and configured to amplify differential voltage levels received from the memory array. The reconfigurable sense amplifier devices may include a plurality of sense amplifier circuits configured to be arranged in one of a plurality of topology configurations, where the topology configurations include a parallel configuration and a cross parallel configuration. The reconfigurable sense amplifier devices may also include one or more switches configured to set the plurality of sense amplifier circuits into the plurality of topological configurations based on one or more control bits.

5 Claims, 9 Drawing Sheets

(58) Field of Classification Search
USPC .................................................. 365/189.02
See application file for complete search history.

(56) References Cited

U.S. PATENT DOCUMENTS

| | | | | |
|---|---|---|---|---|
| 6,034,909 | A * | 3/2000 | Brady | G11C 7/06 |
| | | | | 365/189.09 |
| 6,104,653 | A * | 8/2000 | Proebsting | G11C 7/065 |
| | | | | 257/E21.659 |
| 6,163,475 | A * | 12/2000 | Proebsting | G11C 7/065 |
| | | | | 257/E21.659 |
| 6,198,682 | B1 * | 3/2001 | Proebsting | G11C 7/065 |
| | | | | 257/E21.659 |
| 6,208,575 | B1 * | 3/2001 | Proebsting | G11C 7/065 |
| | | | | 257/E21.659 |
| 6,212,109 | B1 * | 4/2001 | Proebsting | G11C 7/065 |
| | | | | 257/E21.659 |
| 6,240,046 | B1 * | 5/2001 | Proebsting | G11C 7/065 |
| | | | | 257/E21.659 |
| 6,282,135 | B1 * | 8/2001 | Proebsting | G11C 7/065 |
| | | | | 257/E21.659 |
| 6,356,485 | B1 * | 3/2002 | Proebsting | G11C 7/065 |
| | | | | 257/E21.659 |
| 6,373,753 | B1 * | 4/2002 | Proebsting | G11O 5/145 |
| | | | | 257/E21.659 |
| 6,462,584 | B1 * | 10/2002 | Proebsting | G11C 7/065 |
| | | | | 257/E21.659 |
| 6,462,998 | B1 * | 10/2002 | Proebsting | G11C 7/04 |
| | | | | 257/E21.659 |
| 6,665,213 | B1 * | 12/2003 | Michael | G11C 7/062 |
| | | | | 365/185.2 |
| 7,339,842 | B1 | 3/2008 | Hold | |
| 7,898,887 | B2 | 3/2011 | Dudeck et al. | |
| 8,059,452 | B2 | 11/2011 | Liaw | |
| 8,536,898 | B2 | 9/2013 | Rennie et al. | |
| 8,582,389 | B2 | 11/2013 | Gajjewar et al. | |
| 8,780,650 | B2 | 7/2014 | Seningen et al. | |
| 2005/0052894 | A1 * | 3/2005 | Segal | B82Y 10/00 |
| | | | | 365/129 |

OTHER PUBLICATIONS

Yang, et al.; A High-Performance Low VMIN 55nm 512Kb Disturb-Free 8T SRAM with Adaptive VVSS Control; IEEE 2011 SOC Conference; pp. 197-200; Sep. 2011.

Singh, et al.; A 2-Port 6T SRAM Bitcell Design with Multi-Port Capabilities at Reduced Area Overhead; ISQED; Mar. 16, 2010.

Sinangil, et al. A 45nm 0.5V 8T Column-Interleaved SRAM with on-Chip Reference Selection Loop for Sense-Amplifier; IEEE Asian Solid-State Circuits Conference; pp. 225-228; Nov. 2009.

Bhargava, et al.; Low-Overhead, Digital Offset Compensated, SRAM Sense Amplifiers; IEEE 2009 Custom Integrated Circuits Conference; pp. 705-708; Sep. 2009.

Cosemans, et al.; A 3.6pJ/Access 480MHz, 128Kbit on-Chip SRAM with 850MHz Boost Mode in 90nm CMOS with Tunable Sense Amplifiers to Cope with Variability; IEEE 2008 European Solid-State Circuits Conference; pp. 278-281; Sep. 2008.

Suzuki, et al.; A Stable 2-Port Sram Cell Design Against Simultaneously Read/Write-Disturbed Accesses; IEEE Journal of Solid-State Circuits; vol. 43, No. 9, pp. 2109-2119; Sep. 2008.

Nii, et al.; A 45-nm Single-port and Dual-port SRAM family with Robust Read/Write Stabilizing Circuitry under DVFS Environment; 2008 IEEE Symposium on VLSI Circuits Digest of Technical Papers; pp. 212-213; Aug. 2008.

Verma, et al.; A 256 kb 65 nm 8T Subthreshold SRAM Employing Sense-Amplifier Redundancy; IEEE Journal of Solid-State Circuits; vol. 43, No. 1, pp. 141-149; Jan. 2008.

Brea; Mismatch in Circuit Design; Dept. of Electronics and Computer Science University of Santiago de Compostela Santiago de Compostela, Spain; 2007.

Takeda, et al.; A read-static-noise-margin-free SRAM cell for low-VDD and high-speed applications; IEEE Journal of Solid-State Circuits; vol. 41, No. 1, pp. 113-121; Jan. 2006.

* cited by examiner

INTEGRATED CIRCUIT USING TOPOLOGY CONFIGURATIONS

CROSS-REFERENCE TO RELATED APPLICATIONS

This patent application is a divisional of U.S. patent application Ser. No. 14/659,270, filed 2015 Mar. 16 and titled INTEGRATED CIRCUIT USING TOPOLOGY CONFIGURATIONS, the entire disclosure of which is herein incorporated by reference.

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits (IC) may be formed from arrangements of one or more input/output devices, standard devices, memory devices, and/or the like. In one scenario, memory devices may include memory arrays arranged into memory cells and the associated circuitry to write data to the memory cells and read data from the memory cells.

In particular, the memory cells of a memory array, such as a random access memory (RAM) array, may be organized into rows and columns. The logic latches within these individual memory cells may be used to store a data bit that is representative of a logical "1" or "0." These memory cells may also be interconnected by word-lines (WL) and pairs of complementary bit-lines (BL).

In a further scenario, one or more sense amplifiers may be connected to respective pairs of complementary bit-lines. A sense amplifier may be used to sense the low power signals swings on a pair of complementary bit-lines, where the power swings represent a data bit stored within an individual memory cell. The sense amplifier may then amplify the low power signal swings to a recognizable logic level, thereby allowing the data bit to be properly interpreted by logic outside of the RAM array.

In some instances, however, sense amplifiers may be affected by one or more process variations, which may lead to issues such as the creation of an offset voltage within the sense amplifier. In such instances, the offset voltage may result in an inaccurate determination of the value of the data bit stored within an individual memory cell.

BRIEF DESCRIPTION OF THE DRAWINGS

Implementations of various techniques will hereafter be described herein with reference to the accompanying drawings. It should be understood, however that the accompanying drawings illustrate only various implementations described herein and are not meant to limit the scope of various technologies described herein.

DETAILED DESCRIPTION

Various implementations described herein may refer to and may be directed to circuitry for an integrated circuit using topology configurations. For instance, in one implementation, such circuitry may include a memory array having a plurality of memory cells. Such circuitry may also include one or more reconfigurable sense amplifier devices coupled to the memory array and configured to amplify differential voltage levels received from the memory array. The reconfigurable sense amplifier devices may include a plurality of sense amplifier circuits configured to be arranged in one of a plurality of topology configurations, where the topology configurations include a parallel configuration and a cross parallel configuration. The reconfigurable sense amplifier devices may also include one or more switches configured to set the plurality of sense amplifier circuits into the plurality of topological configurations based on one or more control bits.

Various implementations of an integrated circuit using topology configurations will now be described in more detail with reference to FIGS. 1-10.

Integrated Circuit

As noted above, integrated circuits (IC) may be formed from arrangements of one or more input/output devices, standard devices, memory devices, and/or other devices. Input/output devices may be used to provide signals between the connection pins of the IC and the standard devices and memory devices arranged within the IC. Standard devices may be circuit implementations of flip-flops, arithmetic logic units, multiplexers, retention flops, balloon flops, latches, logic gates, and/or the like. Memory devices may include memory arrays arranged into memory cells and the associated circuitry to write data to the memory cells and read data from the memory cells.

Figure 1:
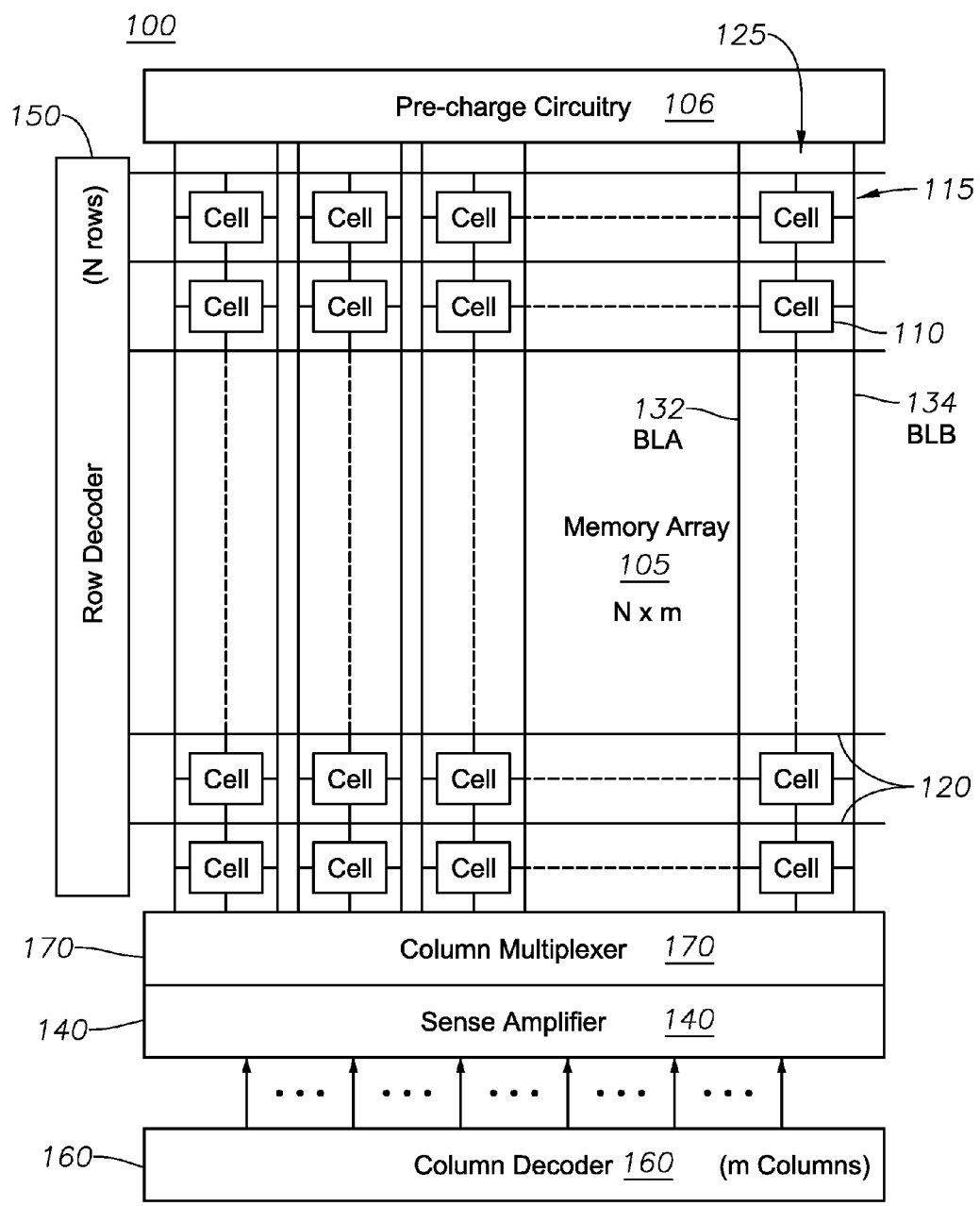
FIG. 1 illustrates a block diagram of an embedded memory device in connection with various implementations described herein.

For example, FIG. 1 illustrates a block diagram of an embedded memory device 100 in connection with various implementations described herein. The memory device 100 may include a memory array 105, pre-charge circuitry 106, row decoder 150, one or more column multiplexers 170, one or more sense amplifiers 140, and column decoder 160.

In particular, the memory array 105 may be a random-access memory (RAM) array, such as a static RAM (SRAM) array, a dynamic RAM (DRAM) array, a correlated electron RAM (ceRAM) array, a ferroelectric RAM (feRAM) array, and/or any other implementation known to those skilled in the art. In some implementations, the memory array 105 may be implemented as a single rail memory array, a dual rail memory array, or any other such implementation known to those skilled in the art.

The memory array 105 may include a plurality of individual memory cells 110, which may be organized in rows 115 and columns 125. As shown in FIG. 1, the array may have N rows and M columns, and, therefore, may have N×M individual memory cells 110. As further described below, these memory cells 110 may include different numbers of transistors (not shown) and may be referred to by the number of transistors. For example, for SRAM arrays, a cell having six transistors may be referred to as a six-transistor or 6-T cell, a cell having eight transistors may be referred to as an eight-transistor or 8-T cell, and/or the like. These transistors may form a data latch or flip-flop (not shown), which may be used to store a data bit that is representative of a logical "1" or "0". In further implementations, additional transistors may be added to control access to the latch transistors.

As illustrated in FIG. 1, each row 115 of memory cells 110 may be connected to at least one of a plurality of word-lines (WL) 120, where each word-line 120 may activate a particular row of memory cells 110. A row decoder 150 may receive address information (e.g., an address word) and then enable the row 115 corresponding to the address word. In some implementations, each row 115 of memory cells 110 may be used to store a word of data. In other implementations, the row may store part of the word or multiple words, such as a half word or a double word.

Further, each column 125 of memory cells 110 may be connected to at least one of a plurality of column bit-lines (BL). In one implementation, a particular memory cell 110 may be coupled to at least one pair of complementary bit-lines, such as BLA 132 and BLB 134. The bit-lines may be used to either store a data bit into a particular cell 110 during a write operation, or to read a stored bit from the particular cell 110 during a read operation. A column decoder 160 may receive address information and enable columns 125 corresponding to the address. The number of columns 125 activated may depend on the size of the word to be stored.

One or more sense amplifiers 140 may be connected to the plurality of column bit-lines. The inputs of each sense amplifier 140 may be a pair of complementary bit-lines 132, 134 of the memory array 105. The sense amplifier 140 may amplify differential voltage signals between the complementary bit-lines 132, 134 of the memory array 105 during a read operation. These small differential voltage signals may be representative of the data bit stored in selected particular individual memory cell 110, and may be amplified by the sense amplifier 140 to a recognizable logic level to allow the data bit to be properly interpreted by logic outside of the memory array 105. Each column 125 may be coupled to at least one sense amplifier 140.

In one implementation, one or more column multiplexers 170 may be used to multiplex the pair of complementary bit-lines in a column 125 into a single set of sense amplifiers 140, thereby reducing the number of sense amplifiers 140. In another implementation, during periods when there is no read or write operation, the pre-charge circuitry 106 may be enabled to pre-charge the voltage level on the complementary bit-lines 132, 134.

Figure 2:
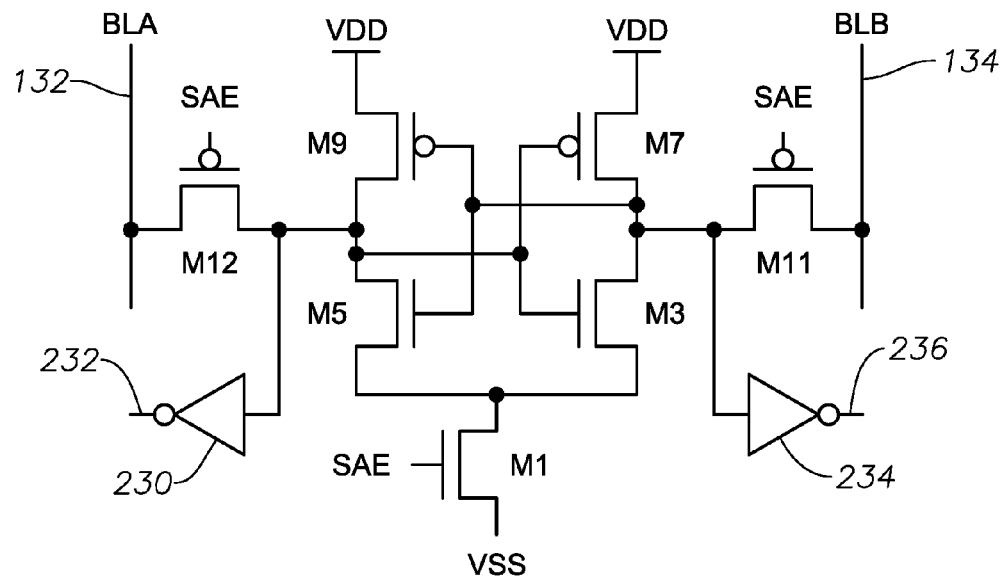
FIG. 2 illustrates a schematic diagram of a sense amplifier in connection with various implementations described herein.

For clarity, FIG. 2 illustrates a schematic diagram of a sense amplifier 140 in connection with various implementations described herein. In one implementation, the sense amplifier 140 may consist of 2 to 6 transistors. In another implementation, the memory device 100 may contain hundreds or thousands of sense amplifiers 140.

As stated above, during a read operation, the sense amplifier 140 may sense the low power signals between the complementary bit-lines 132, 134, which may represent a data bit stored within the individual memory cell 110, and then amplify the small voltage swing to a recognizable logic level. Upon amplification, the data bit may be latched into a buffer (not shown) and put on an output bus (not shown).

As shown in FIG. 2, bit-line 132 may be coupled to a drain of the pMOS pass-gate transistor M12 and bit-line 134 may be coupled to a drain of the pMOS pass-gate transistor M11. The source of pMOS pass-gate transistor M12 may be coupled to an inverter 230, the output of which corresponds to output 232. The source of pMOS pass-gate transistor M11 may be coupled to an inverter 234, the output of which corresponds to output 236. In addition, the sense amplifier 140 may be enabled via a sense amplifier enable (SAE) signal. As shown, the gates of transistors M12 and M11, along with nMOS transistor M1, may receive the SAE signal.

During a read operation, one of a plurality of word-lines (WL) 120 (not shown) may be enabled. This may lead to a differential voltage on the complementary bit-lines 132 and 134. Before the sense amplifier 140 is enabled, the SAE signal may be low. Accordingly, a latch composed of the nMOS transistors M3 and M5 and the pMOS transistors M7 and M9 may not have a path to VSS. Further, the pMOS pass-gate transistors M12 and M11 may couple the voltages of the complementary bit-lines 132 and 134 onto the internal nodes of the latch.

When the sense amplifier 140 is enabled (i.e., the SAE signal is high), a path to VSS may be activated by way of nMOS transistor M1. Further, the pass-gate transistors M12 and M11 may be disabled, thereby decoupling the internal nodes of the latch from the complementary bit-lines 132 and 134. When the complementary bit-lines 132 and 134 are decoupled from the internal nodes of the latch, the output of the sense amplifier 140 may be based on the previous differential voltage between the complementary bit-lines 132 and 134.

Figure 3:
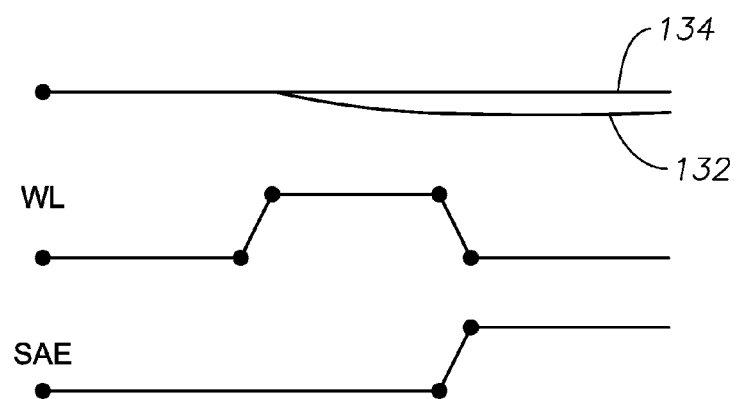
FIG. 3 illustrates waveforms for a sense amplifier in connection with various implementations described herein.

FIG. 3 illustrates waveforms for a sense amplifier 140 in connection with various implementations described herein. In particular, the waveforms of FIG. 3 illustrate how a sense amplifier 140 may resolve the differential signals on the complementary bit-lines 132 and 134 during a read-operation. As shown, the voltage on the bit-line 132 may be slightly lower than the voltage on bit-line 134.

When the sense amplifier 140 is enabled by the signal SAE, the voltage on the internal nodes of the inverter coupled to bit-line 132 may be slightly lower than the voltage on the internal node of the inverter coupled to bit-line 134. Due to the regenerative action of the latches, this difference in voltage may be amplified to a full swing, with the voltage on the internal node of the inverter coupled to bit-line 132 resolving to VSS, and the voltage on the internal node coupled to bit-line 134 resolving to VDD. Therefore, the output 232 of the inverter 230 may be high to represent that bit-line 134 is high with respect to bit-line 132.

In some implementations, the sense amplifier 140 may be affected by the process variations, such as the lithography process, the fabrication process, the packaging process, and/or the like. Such process variations may result in a mismatch in the threshold voltages of paired MOSFETs within the sense amplifier 140, and the creation of an offset voltage. In some instances, the output of the sense amplifier 140 may be based on the offset voltage as opposed to a differential voltage between the bit-lines 132 and 134. As such, the output of the sense amplifier may be incorrect.

For example, if the sense amplifier 140 has an offset voltage of 60 millivolts (mV) and the differential voltage between bit-lines 132 and 134 is 40 mV, the sense amplifier 140 may amplify the offset voltage as opposed to the differential voltage. Therefore, the offset voltage of the sense amplifier 140 should be smaller than that of the differential voltage at the time the sense amplifier 140 is enabled in order for the sense amplifier 140 to accurately determine the content of the data bit within the memory cell 110.

The process variations which may cause such an offset voltage may include local variations and global variations. Local variations, or intra-die variations, may be attributable to variations in line edge roughness and random dopant fluctuations in the Metal Oxide Semiconductor Field Effect Transistor (MOSFET) channel. Random dopant fluctuations may be process related, and may be the result of variations in the implanted impurity concentration. As integrated circuits are scaled down in size, these dopant fluctuations may become significant, as the number of dopants atoms in the MOSFET channel may be proportionally fewer. This local variation may enhance the asymmetry of paired MOSFETS within ratio devices, such as a sense amplifier 140 discussed herein, and therefore its offset voltage. Global variations of these process variations, or die-to-die variation, may be attributable to variations of the MOSFET channel length ($L_g$), MOSFET channel width (W), dopant channel concentrations, and/or gate oxide thickness.

Further, other devices and/or circuitry of the integrated circuit, such as those related to memory devices, may be affected by the above-described process variations, such as through the creation of offset voltages in these other devices and/or circuitry. For example, process variations may result in memory cells 110 that are weaker and, in turn, able to generate less differential voltage on the complementary bit-lines 132 and 134. If a memory array 105 cannot correctly identify the information contained in the cell 110, then it may not be able to function as an embedded memory device within the integrated circuit, thereby reducing the yield of the integrated circuit.

Integrated Circuit Using Multiple Topologies

To mitigate the effects of process variations in ICs, which may lead to offset voltages as described above, the devices and/or circuitry of the ICs may be configured into one of a plurality of topologies. Such an implementation may allow for the reduction of offset voltage in the IC, since a topology which exhibits the least amount of offset voltage can be selected from the plurality of topologies.

For example, and as further described below, sense amplifiers used in a memory device of an IC may be reconfigured into one of a plurality of topologies, where the topologies may include a parallel topology and/or a cross-parallel topology. It should be noted, however, that the implementations described below may be used for other devices and/or circuitry of ICs exhibiting mismatch due to processing variations, such as operational amplifiers, instrumentation amplifiers, timers, voltage and current regulators, filters, sensors, switches, transducers, digital to analogue converters (DAC), analogue to digital converters (ADC), and/or the like.

Reconfigurable Sense Amplifier

Figure 4:
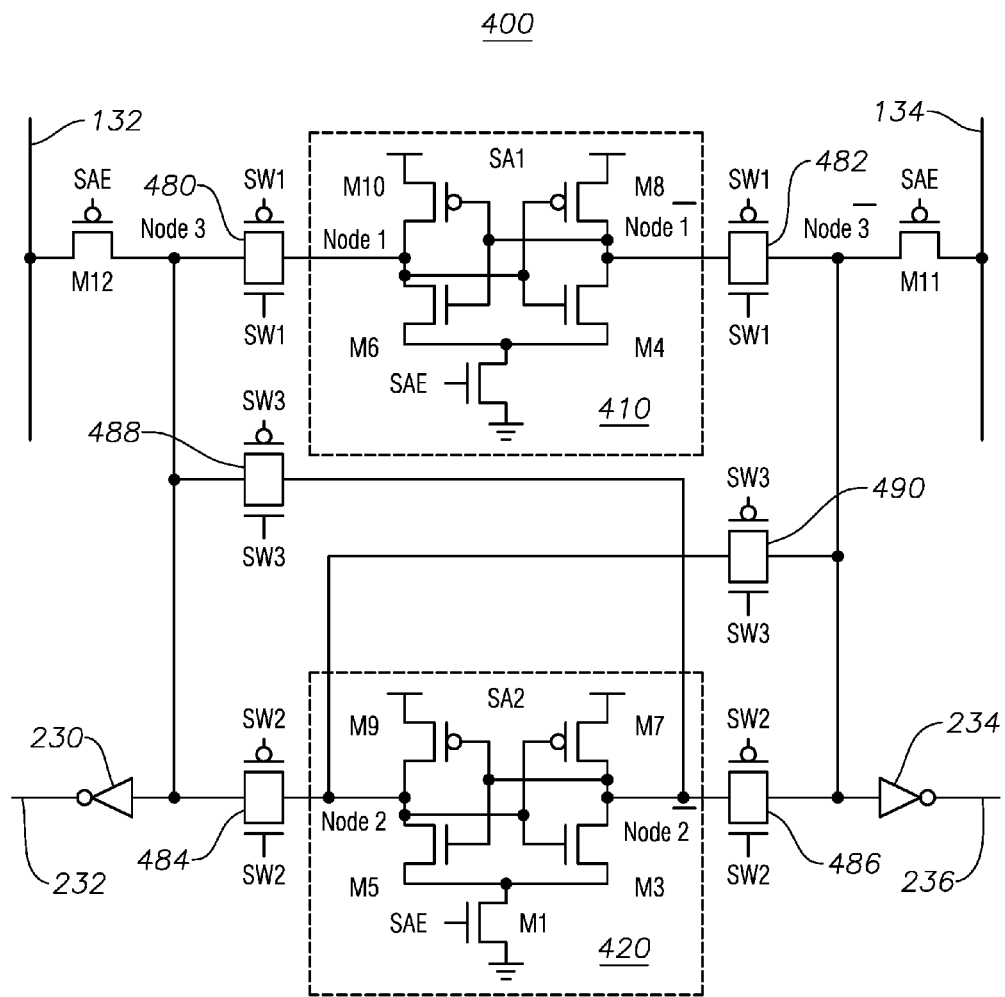
FIG. 4 illustrates a schematic diagram of a reconfigurable sense amplifier device in accordance with various implementations described herein.

FIG. 4 illustrates a schematic diagram of a reconfigurable sense amplifier device 400 in accordance with various implementations described herein. As further described below, the reconfigurable sense amplifier device 400 may be placed into one of a plurality of different topologies.

The reconfigurable sense amplifier device may include a plurality of sense amplifier circuits, such as sense amplifier 140 described above. As shown, the device 400 may include two sense amplifiers, sense amplifier 1 (SA1) 410 and sense amplifier 2 (SA2) 420, which may be similar to the sense amplifier 140. While only two sense amplifiers are illustrated, it will be understood by a person skilled in the art that more than two may be used. In another implementation, the sense amplifiers of the device 400 may be selected from one or more common pools of sense amplifiers, with the number of sense amplifiers and their configurations being determined by factors such as: the voltage offset of the individual sense amplifiers, their location within the integrated circuit, and the speed, power distribution, and yield of memory arrays and/or IC.

In one implementation, the functionality of the SA1 410 and SA 420 may be the same. In a further implementation, the circuitry for SA1 410 and SA2 420 may also be the same. However, for other implementations, it will also be understood by a person skilled in the art that while the functionality of the SA1 410 and SA 420 may be the same, the circuitry for implementing that functionality may be different.

In one implementation, SA1 410 and SA 420 may be substantially the same size. In another implementation, SA1 410 and SA2 420 may be of a different size. For example, SA2 420 may be physically larger than SA1 410, whereby SA1 410 may be used to obtain minimum power dissipation while SA2 420 may be used to obtain absolute yield and/or performance. In a further implementation, the relative scaling of SA1 410 and SA2 420 may be non-linear, depending on the process technology, the standard deviation of the manufacturing variances, and/or combination thereof. As such, scaling may increase or decrease the absolute size of the individual sense amplifiers and/or their individual components. Scaling may also be determined by other factors known to a person of ordinary skilled in the art.

As shown in FIG. 4, the reconfigurable sense amplifier device 400 may include a plurality of pMOS pass-gate transistors M12 and M11. The drain of the pMOS pass-gate transistor M12 may be coupled to bit-line 132 and the drain of the pMOS pass-gate transistor M11 may be coupled to bit-line 134. The source of pMOS pass-gate transistor M12 may be coupled to an inverter 230, the output of which corresponds to output 232. The source of pMOS pass-gate transistor M11 may be coupled to an inverter 234, the output of which corresponds to output 236.

The node corresponding to the source of pMOS pass-gate transistor M12 may be referred to as "node 3", and the node corresponding to the source of pMOS pass-gate transistor M11 may be referred to as "node $\overline{3}$". Further, the node corresponding to the junction of the latch composed of nMOS transistor M5 and pMOS transistor M9 of SA2 420 may be referred to as "node 2". The node corresponding to the junction of the latch composed of nMOS transistor M3 and pMOS transistor M7 may be referred to as "node $\overline{2}$". The node corresponding to the junction of the latch composed of nMOS transistor M6 and pMOS transistor M10 of SA1 410 may be referred to as "node 1". In addition, the node corresponding to the junction of the latch composed of nMOS transistor M4 and pMOS transistor M8 may be referred to as "node $\overline{1}$".

Further, the reconfigurable sense amplifier device 400 may also include a plurality of pass-gate switches. In one implementation, the device 400 may include three pairs of switches (sense amplifier switches): SW1 480 and 482, SW2 484 and 486, and SW3 488 and 490. In such an implementation, SW1 480 may be positioned between node 1 and node 3, SW1 482 may be positioned between node $\bar{1}$ and node $\bar{3}$, SW2 484 may be positioned between node 2 and node 3, SW2 486 may be positioned between node $\bar{2}$ and node $\bar{3}$, SW3 488 may be positioned between node $\bar{2}$ and node 3, and SW3 490 may be positioned between node 2 and node $\bar{3}$.

In operation, based on the statuses of the pass-gate switches, the reconfigurable sense amplifier device 400 may transition among one of four possible reconfigurable topologies. Those reconfigurable topologies include: 1) a configuration that uses only SA1 410; 2) a configuration that uses only SA2 420; 3) a configuration that uses both SA1 410 and SA2 420, where SA1 410 and SA2 420 are directly connected and in parallel (denoted as "SA1+SA2"); and 4) a configuration that uses both SA1 410 and SA2 420, where SA1 410 and SA2 420 are cross connected and in cross parallel (denoted as "SA1−SA2"). For the SA1−SA2 configuration, SA1 and SA2 are connected in parallel but with the inputs of SA2 420 swapped for one another. In a further implementation, the number of sense amplifiers may be greater than two, and there may be additional and/or alternative configurations. For example, there may be three sense amplifiers, and they may be configured such that two are in parallel and the third is in cross parallel.

With respect to the reconfigurable sense amplifier device 400, the various topology configurations may be determined based on the pairs of pass-gate switches: SW1 480 and 482, SW2 484 and 486, and SW3 488 and 490. In particular, a specific combination of activated pass-gate switches may place the reconfigurable sense amplifier device 400 into one of the possible reconfigurable topologies.

Figure 5:
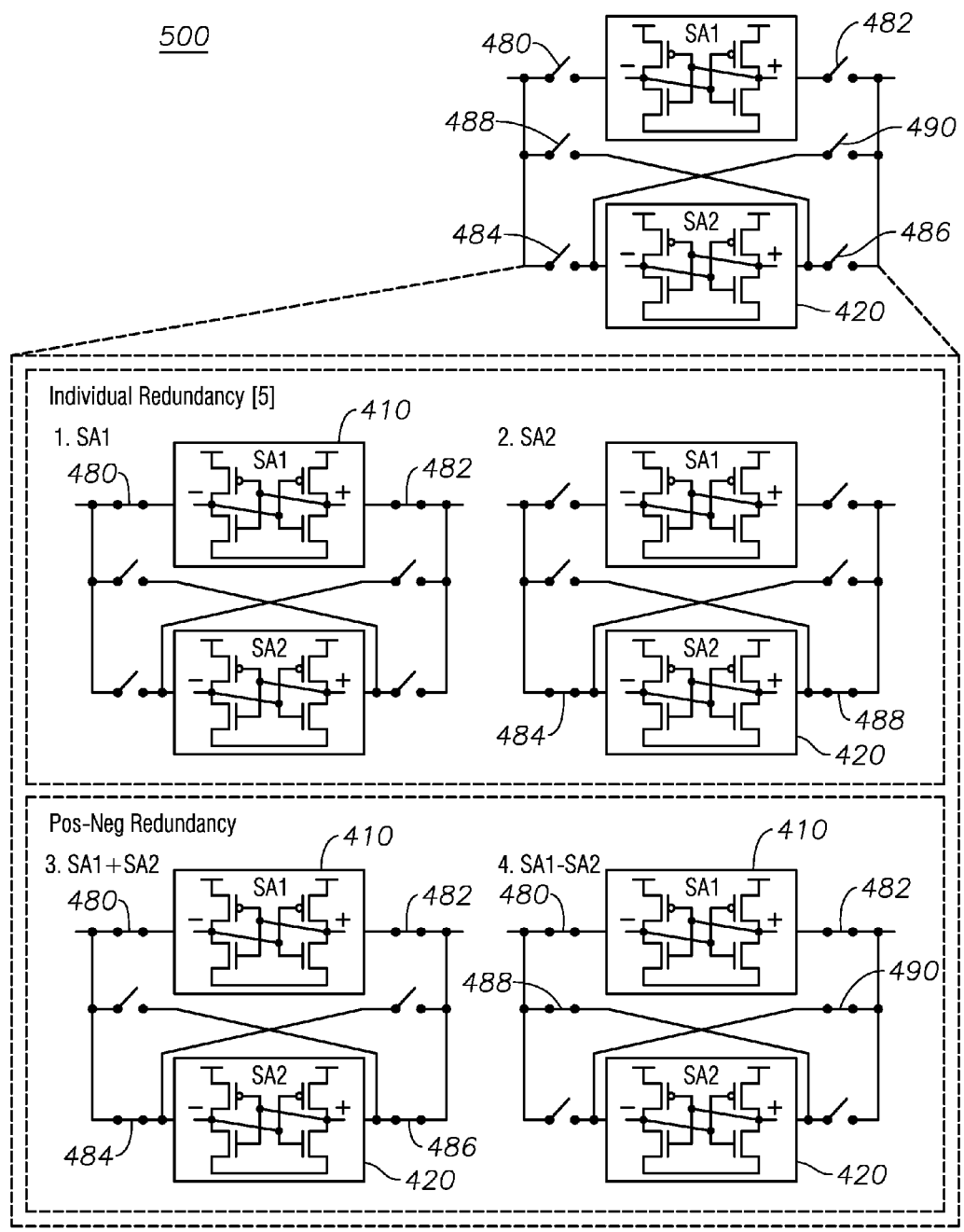
FIG. 5 illustrates configurations of a reconfigurable sense amplifier device in accordance with various implementations described herein.

For example, FIG. 5 illustrates configurations of the reconfigurable sense amplifier device 400 in accordance with various implementations described herein. As shown, the SA1 configuration may be selected if only SW1 480 and 482 are activated. The SA2 configuration may be selected if only SW2 484 and 486 are activated. The SA1+SA2 configuration may be selected if only SW1 480, 482 and SW2 484, 486 are activated. The SA1−SA2 configuration may be selected if only SW1 480, 482 and SW3 488, 490 are selected.

To activate particular pass-gate switches, one or more control bits may be used. For example, as shown in FIG. 4, one of the four reconfigurable topologies may be determined using control bits C1 and C2 and one or more corresponding logic functions. In particular, a NAND operation on the control bits may be used to activate switches SW1 480 and 482, and a NOR operation on the control bits may be used to activate switches SW3 488 and 490. Switches SW2 484 and 486 may correspond directly to bit C1. Accordingly, the control bits may be used to select a particular topology configuration of the reconfigurable sense amplifier device 400. Other implementations of control bits and/or logic functions may be used to activate the switches and, in turn, select a particular topology configuration.

Figure 6:
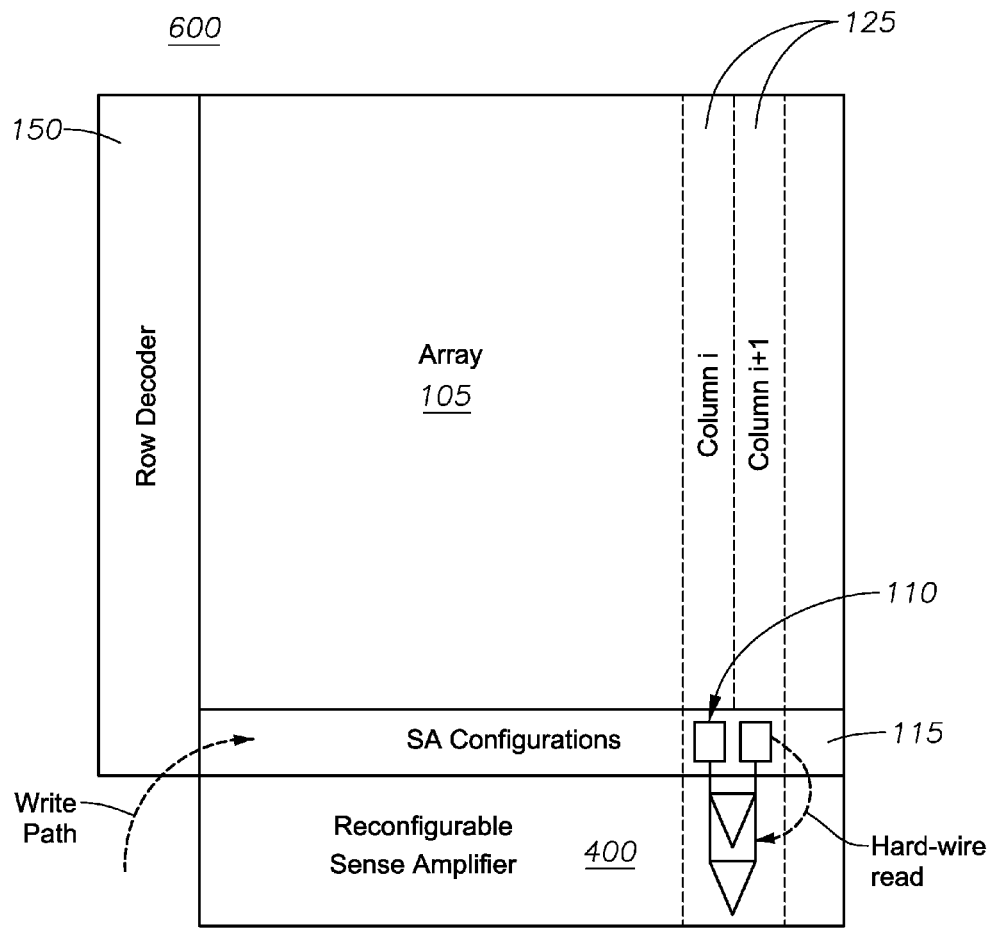
FIG. 6 illustrates a block diagram of a memory device having configuration bits stored thereon in accordance with various implementations described herein.

In one implementation, the control bits may be written into memory. For example, FIG. 6 illustrates a block diagram of a memory device 600 having configuration bits stored thereon in accordance with various implementations described herein. The memory device 600 may be similar to that of memory device 100, in that it includes a memory array 105, row decoder 150, one or more column multiplexers (not shown), and one or more reconfigurable sense amplifier devices 400. The memory array 105 may include a plurality of memory cells 110, which may be organized into rows 115 and columns 125.

As shown in FIG. 6, control bits C1 and C2 may be written to two individual memory cells 110 of the last row of the array 105. In conjunction with 2:1 column multiplexing, the control bits may be stored immediately above the sense amplifiers SA1 410 and SA2 420. In one implementation, due to the proximity of SA1 410 and SA2 420, the control bits may be directly hard-wired to the storage nodes of the sense amplifiers using fuses. In another implementation, values of the control bits may be determined using a calibration process and/or Built-In Self-Test (BIST). In yet another implementation, there may be no column multiplexing, and the control bits C1 and C2, may be stored in the individual cells of the last two rows 115 of the array 105.

Referring back to FIG. 4, the control bits, C1 and C2, and the pairs of pass-gate switches, SW1 480 and 482, SW2 484 and 486, and SW3 488 and 490, may be used to implement the various topologies of the reconfigurable sense amplifier device 400. Having a configuration that uses only SA1 410 and a configuration that uses only SA2 420 may create redundancies for the individual sense amplifiers in the device 400. In addition, having the SA1+SA2 configuration and the SA1−SA2 configuration may create additional redundancies for implementing sense amplifiers in an IC. In another implementation, SA1 410 and SA2 420 may periodically have a path to VSS even though one of them may not be utilized based on an implemented topology. In a further implementation, additional circuitry and/or logic may be implemented such that SA1 410 and/or SA2 420 are enabled only during a read-operation when utilized by a particular topology.

Each of the four possible reconfigurable topologies may have a particular offset voltage associated with it. Specifically, the configuration that uses only SA1 410 may have an offset voltage of V1; the configuration that uses only SA2 420 may have an offset voltage of V2; 3) the SA1+SA2 configuration may have an offset voltage of (V1+V2)/2; and 4) the SA1−SA2 configuration may have an offset voltage of (V1−V2)/2. For the SA1+SA2 and SA1−SA2 configurations, the total offset voltage of the device 400 is the average of the individual voltage offsets of SA1 and SA2. Therefore, the individual offset voltages may compensate each other when they have the opposite sign or may be added together when they have the same sign.

Thus, the reconfigurable structure of the reconfigurable sense amplifier device 400 has the capability to: 1) allow each of the SA1 410 and SA2 420 to be individually connected and/or disconnected, and/or 2) individually maintain or swap two of the differential inputs for SA1 410 and SA2 420. As shown in FIG. 4, SA2 420 is configured to have its differential inputs swapped. In one implementation, circuitry may allow each of the differential inputs of both sense amplifiers to be swapped. Therefore, the reconfigurable structure of the device 400 allows: 1) the individual voltage offset contribution of each of the sense amplifiers, SA1 410 and SA2 420, to be included or excluded, and/or 2) the polarity of each of the voltage offsets of SA1 410 and SA2 420 to be maintained and combined, and/or 3) the polarity of SA2 420 voltage offset to be inverted, and combined with that of SA1 410.

In one implementation, after fabrication, values for the control bits may be selected by a controller, such that the topology having the smallest offset voltage is the implemented topology in device 400. In another implementation, certain topologies may have a higher probability of resulting in a lower offset voltage. For example, these configurations may be the parallel SA1+SA2 and cross-parallel SA1−SA2 configurations. In a further implementation, this characteristic may be exploited to reduce the number of control bits and pairs of pass-gate switches. For example, in such an implementation, only the parallel SA+SA2 and cross-parallel SA1−SA2 topology configurations may be implemented. Accordingly, the device 400 may only use a single control bit and two pairs of pass-gate switches, SW1 480, 482 and SW3 488, 490.

As discussed above, positioning two or more sense amplifiers in parallel or cross parallel within the area of device 400 may lead to a reduced offset voltage when compared to using a single sense amplifier within the same area. Such a reduction in offset voltage for the reconfigurable sense amplifier device 400 can be theoretically shown by simple statistical analysis as follows. Assuming a normal distribution, N(0,1), ($\sigma_{Conv}$=1) for a sense amplifier within a predefined area. If the predefined area is then divided to accommodate k smaller sense amplifiers, each will have, according to Pelgrom's model, $\sqrt{k}$ times larger standard deviation, as shown below:

$$\sigma_{SmallSA}=\sqrt{k}\sigma_{Conv} \quad \text{Equation 1.}$$

By putting two of these smaller sense amplifiers in parallel, the total offset will be the average of the two sense amplifiers offset voltages, which yields another Gaussian distribution with standard deviation of:

$$\sigma_{Parallel\_SmallSA}=(\sqrt{k/2})\sigma_{Conv} \quad \text{Equation 2.}$$

The probability of error of the individual redundancy may then be:

$$\Pr(\text{Error})=\Pr(\text{SmallSA}_{Offset}>\text{Vin})^2 \quad \text{Equation 3.}$$

The probability of error of the Pos-Neg Redundancy may then be:

$$\Pr(\text{Error})=\Pr(\text{Parallel\_SmallSA}_{Offset}>\text{Vin})^2 \quad \text{Equation 4.}$$

The probability of error of the Reconfigurable SA may then be:

$$\Pr(\text{Error})=\Pr(\text{SmallSA}_{Offset}>\text{Vin})^2 \cdot \Pr(\text{Parallel\_SmallSA}_{Offset}>\text{Vin})^2 \quad \text{Equation 5}$$

Figure 7:
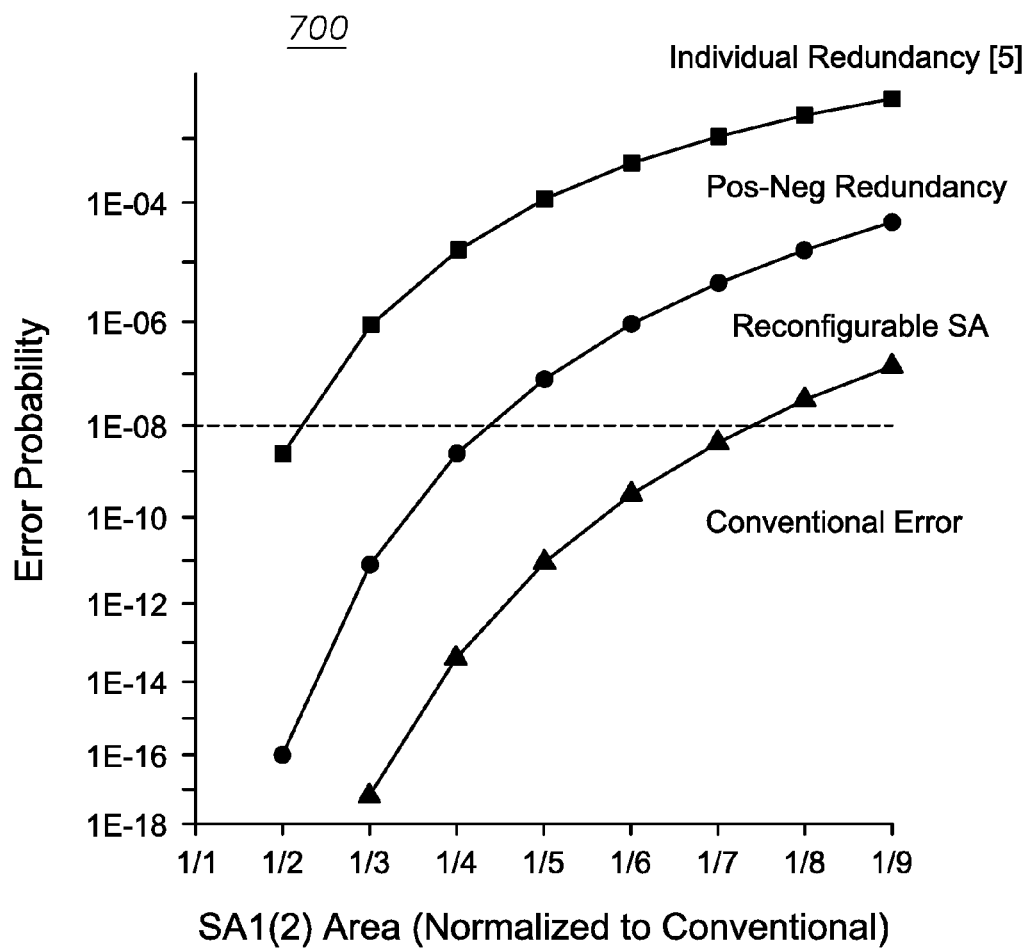
FIG. 7 illustrates a plot of the probability of error for various sense amplifier configurations in accordance with various implementations described herein.

FIG. 7 illustrates a plot 700 of the probability of error for various sense amplifier configurations in accordance with various implementations described herein. The plot may have a fixed differential input (5.73$\sigma_{Conv}$, translating to an error probability of 1−e8) for the conventional sense amplifier 140, individual redundancy SA1 and SA2, parallel SA1+SA2 and cross parallel SA1−SA2. As can be seen from FIG. 7, the use of a reconfigurable sense amplifier device 400 considerably reduces the probability of error even within a smaller total die area.

Referring to FIG. 7, a reconfigurable sense amplifier device 400 may be used to obtain a statistically lower voltage offset within a given die area as compared to a single sense amplifier 140 of substantially comparable size. Therefore, the reconfigurable sense amplifier device 400 may be used to improve the absolute yield of embedded memory arrays 105, to improve the speed of embedded memory arrays 105, to reduce the power dissipation within the embedded memory arrays 105, and/or combinations thereof. In this manner, the use of various reconfigurable topologies may be used to obtain substantially the same offset voltage performance as a single sense amplifier 140 within a smaller die area. As mentioned above, the reconfigurable sense amplifier device 400 may include more than 2 sense amplifiers. The number of topology configurations and/or configurations bits may increase accordingly with the number of sense amplifiers. In one implementation, this characteristic may be exploited to reduce or optimize the calibration time for a particular reconfigurable topology to be selected. For example, the calibration process may start with the topology configuration and/or configurations that statistically have the highest probability of minimizing the voltage offset of the sense amplifier, and then terminate once a topology configuration has been tested that satisfies the required performance without testing the remaining configurations. In another implementation, the calibration process may be used to batch select (i.e., grade) sense amplifiers 140 and therefore the embedded memory arrays and integrated circuits. For example, the number of configurations tested, and therefore the total calibration time, may be increased to establish a higher yield and/or grade of integrated circuits.

The performance for the reconfigurable sense amplifier device 400 may be determined by a number of factors. For example, a minimum offset voltage may depend on a supply voltage that the integrated circuit and the memory arrays 105 are designed to operate at and/or whether the supply voltage is regulated or unregulated. Despite large variations in threshold voltage between match pair devices within the sense amplifier 140, the sense amplifier 140 may still be electrically stable while operating at these low supply voltages. Therefore, to ensure this higher performance requirement can be satisfied, more configurations may be tested.

The performance may also depend on the energy management architecture of the integrated circuit, which may include sleep/hibernation power saving modes. In one implementation, there may be more topology configurations and/or configurations tested during calibration for sense amplifiers that have to sense data bits and/or dissipated minimum power in sleep/hibernation mode. For example, in sleep/hibernation mode, some of the memory array 105 may be on a switched supply rail that is isolated during sleep/hibernation mode, and/or the supply voltage may be lowered to reduce power dissipated as part of a power saving energy management function. As such, the number of topology configurations and/or the calibration processes may vary depending on the sense amplifiers' physical location within the integrated circuit.

The performance of the reconfigurable sense amplifier device 400 may also depend on the system timing and/or expected operating temperature of the integrated circuit and the memory array 105. The latter may depend on the device packaging, which may vary.

As stated above, the reconfigurable sense amplifier device 400 may be used to improve the absolute yield and/or performance, and/or to obtain a given performance within a smaller die area than an equivalent conventional single sense amplifier 140.

Integrated Circuit Using Dual Port Memory Cells

In some implementations, the memory cell 110 as described above may be implemented as a single port memory cell, a dual port memory cell, or any other such implementation known to those skilled in the art. For example, the memory cell 110 may be a dual port memory cell, such as an eight-transistor (8-T) memory cell.

Figure 8:
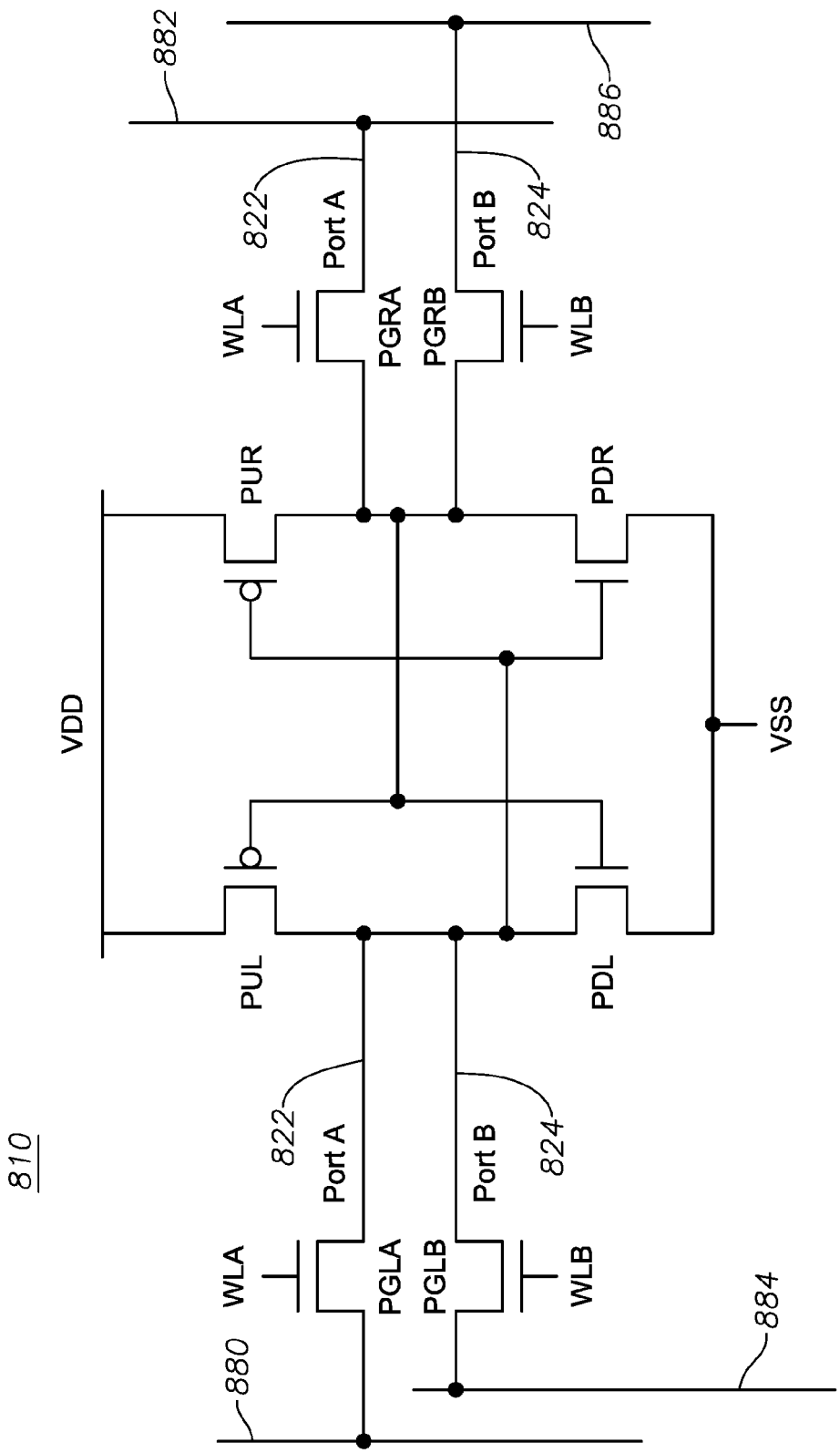
FIG. 8 illustrates a schematic diagram of a dual port random-access memory (RAM) eight transistor cell in accordance with various implementations described herein.

FIG. 8 illustrates a schematic diagram of a dual port 8-T memory cell 810 in accordance with various implementations described herein. The memory cell 810 may include two sets of word-lines and data ports. In one implementation, the memory cell 810 may be similar to the memory cells disclosed in U.S. Pat. No. 8,582,389, which is herein incorporated by reference. In addition, the memory cell 810 may be part of a memory array similar to memory array 105 as described above.

As shown in FIG. 8, the memory cell 810 may include pMOS pull-up transistors PUL and PUR and nMOS pull-down transistors PDL and PDR. Pass-gate transistors PGLA and PGRA may form a first port (port-A) 822 of the memory cell 810. Pass-gate transistors PGLB and PGRB may form a second port (port-B) 824 of the memory cell 810. The gates of pass-gate transistors PGLA and PGRA may be controlled by the word-line (WLA) at port-A, while the gates of pass-gate transistors PGLB and PGRB may be controlled by the word-line (WLB) at port-B. A latch composed of the pull-up transistors PUL and PUR and pull down transistors PDL and PDR may store a data bit. The stored data bit can be read through port-A using a first pair of complementary bit-lines 880 and 882. The stored data bit can also be read through the port-B 824 using a second pair of complementary bit-lines 884 and 886.

In one implementation, in response to a read request, data may be read out of the memory cell 810 using either the first pair or the second pair of bit-lines, depending on which of WLA or WLB is activated. In particular, based on the configuration of the pass-gate transistors PGLA and PGRA, data may be read out of the first pair of bit-lines if WLA is activated, whereas, based on the configuration of the pass-gate transistors PGLB and PGRB, data may be read out of the second pair of bit-lines if WLB is activated.

In such an implementation, during a read operation, data may be read out of the memory cell 810 using either the first pair or the second pair of bit-lines, but not both pairs of bit-lines. Accordingly, during a read operation, only one of WLA or WLB may be activated, but not both. Such selective activation of the word-lines may be used to mitigate effects of read disturb of the memory cell 810.

In particular, during a read operation, the first pair and the second pair of bit-lines may operate independently of each other, such that the first pair and the second pair of bit-lines may be isolated from one another. This is in contrast to some implementations where the first and the second pair of bit-lines may operate in conjunction with one another during certain write operations, as discussed, for example, in U.S. Pat. No. 8,582,389. In a further implementation, only one of the first pair or the second pair of bit-lines may be pre-charged. In particular, only the pair of bit-lines to be used during the read operation may be selected for precharging. Such selective precharging may be used for low voltage operations.

In such implementations where data is read out only one of the first pair and the second pair of bit-lines, the selection of which of the pairs of bit-lines to use during the read operation may be based on which pair provides the better readability. Readability may depend on fabrication variations, where such variations may include some pass-gate transistors having different current outputs than other pass-gate transistors of the memory cell, metal mismatch between port-A and port-B, current changes in the transistors of the memory cell due to capacitance on the pairs of bit-lines, and/or any other fabrication variation known to those skilled in the art. Accordingly, the redundant use of dual pairs of bit-lines with the memory cell 810 may allow for an optimal selection of bit-lines for use during a read operation.

In a further implementation, the first pair of complementary bit-lines 880 and 882 and the second pair of complementary bit-lines 884 and 886 may each be coupled to sense amplifiers, such as the sense amplifiers 140 discussed above with respect to FIGS. 1 and 2.

Figure 9:
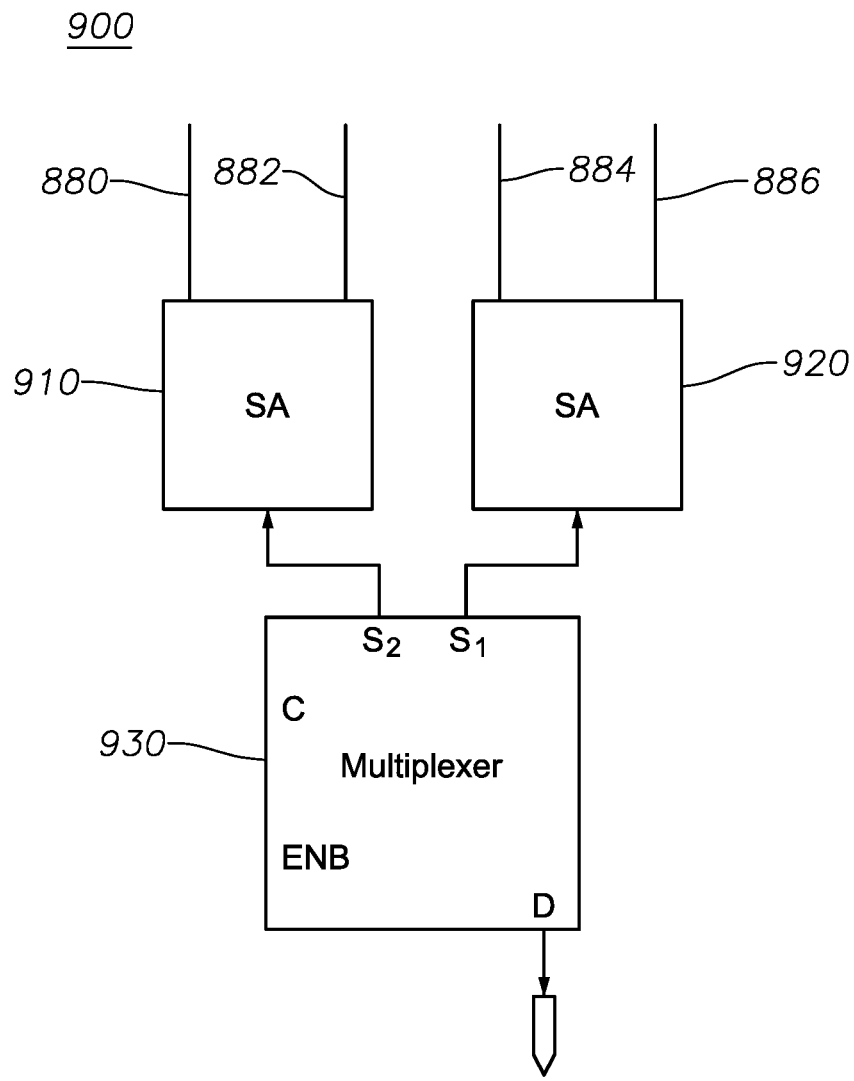
FIG. 9 illustrates a schematic diagram of sense amplifiers coupled to pairs of complementary bit-lines in accordance with various implementations described herein.

For example, FIG. 9 illustrates a schematic diagram 900 of sense amplifiers coupled to pairs of complementary bit-lines in accordance with various implementations described herein. As shown, the first pair of complementary bit-lines 880 and 882 may transmit data to a first sense amplifier 910, and the second pair of complementary bit-lines 884 and 886 may transmit data to a second sense amplifier 920. In one implementation, the first sense amplifier 910 and the second sense amplifier 920 may be identical or substantially identical. Further, a 2-to-1 multiplexer 930 may be used to select which of the sense amplifier outputs is to be transferred to other circuitry of the IC.

In one implementation, the multiplexer 930 may be used to select the sense amplifier output corresponding to the pair of bit-lines that provides the better readability, as discussed above. In another implementation, the multiplexer 930 may be used to select the sense amplifier output corresponding to the sense amplifier having the least effects related to process variations, such as the sense amplifier having the least amount of offset voltage. Accordingly, the redundant use of dual pairs of bit-lines and/or the substantially identical sense amplifiers with the memory cell 810 may allow for an optimal selection of bit-lines and/or sense amplifiers for use during a read operation of the memory cell 810.

Figure 10:
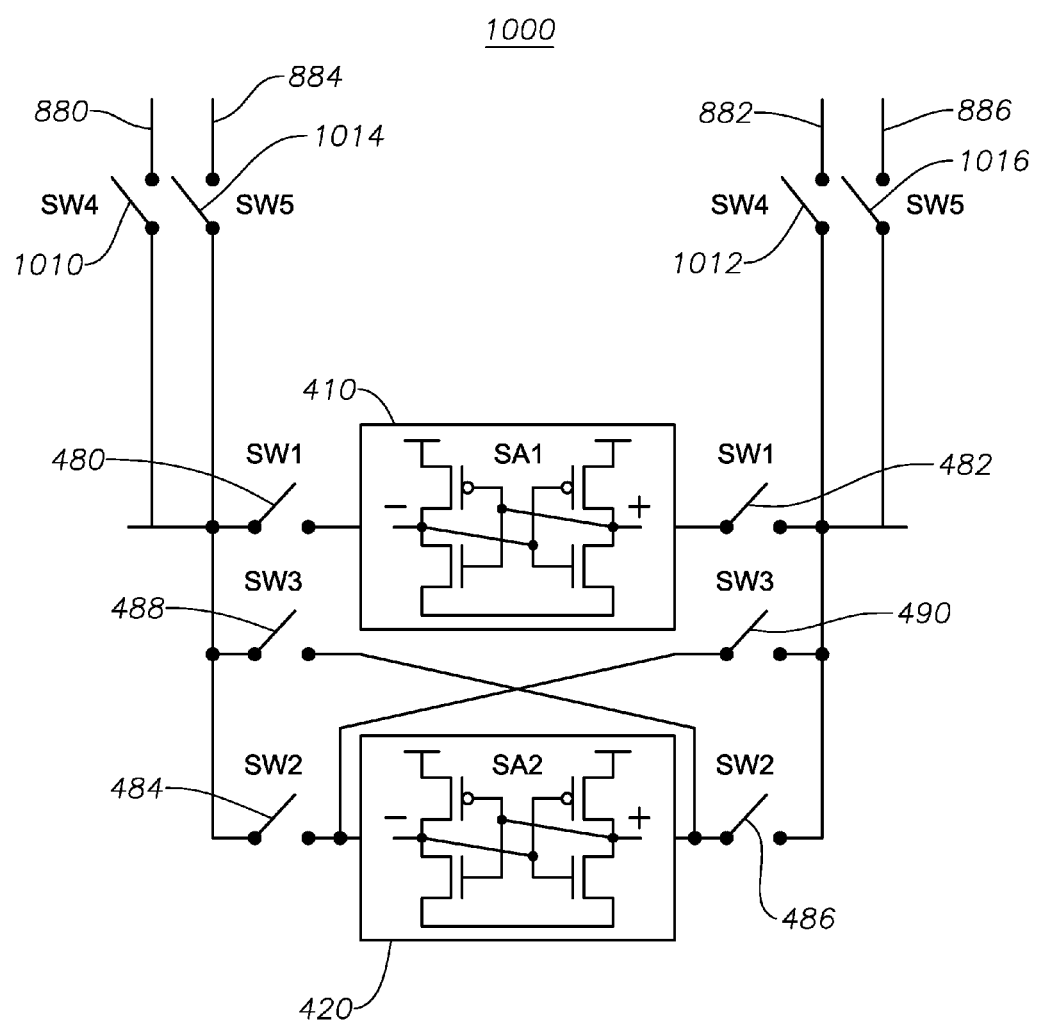
FIG. 10 illustrates a schematic diagram of a reconfigurable sense amplifier device for use with a dual port memory cell in accordance with various implementations described herein.

FIG. 10 illustrates a schematic diagram of a reconfigurable sense amplifier device 1000 for use with the dual port memory cell 810 in accordance with various implementations described herein. The device 1000 may be similar to the reconfigurable sense amplifier device 400 as discussed above with respect to FIG. 4. In particular, the device 1000 may include sense amplifier SA1 410 and sense amplifier SA2 420, with circuitry and various topology configurations and redundancy as determined by the three pairs of switches (sense amplifier switches): SW1 480 and 482, SW2 484 and 486, and SW3 488 and 490.

In addition, the device 1000 may further include a plurality of bit-line pass-gate switches. In particular, the device 1000 may include two pairs of bit-line pass-gate switches: 1) SW4 1010 and 1012, and 2) SW5 1014 and 1016. As shown, SW4 1010 and 1012 may be used to couple the first pair of complementary bit-lines 880 and 882 to the reconfigurable sense amplifier device 1000, while SW5 1014 and 1016 may be used to couple the second pair of complementary bit-lines 884 and 886 to the reconfigurable sense amplifier device 1000.

As similarly discussed above, data may be read out of a dual port memory cell (not shown) using either pair of bit-lines coupled to the reconfigurable sense amplifier device 1000, but not both pairs of bit-lines. In particular, the bit-line pass-gate switches SW4 or the bit-line pass-gate switches SW5 may be used to couple one pair of bit-lines to the reconfigurable sense amplifier device 1000. In such an implementation, the bit-line pass-gate switches may be used to couple one pair of bit-lines to the pass-gate transistors of the reconfigurable sense amplifier device 1000 (i.e., PGLA and PGRA or PGLB and PGRB).

As shown, and as discussed above, these bit-line pass-gate switches may be used to exploit the redundant use of dual pairs of bit-lines with the dual port memory cell 810 by allowing for an optimal selection of bit-lines for use during a read operation of the cell 810. In particular, the bit-line pass-gate switches may be used to select the pair of bit-lines having the better readability. As discussed above with respect to FIG. 8, readability may depend on fabrications variations and/or the like.

In one implementation, the various topology configurations of device 1000 may be determined by an additional configuration bit C3 (not shown) and corresponding logic functions (not shown). In a further implementation, the configuration bit C3 may be stored in a memory array in a manner similar to that described herein with respect to the storage of C1 and C2. In another implementation, the topology configuration chosen may be determined by a calibration test and/or BIST function. This calibration test and/or BIST function may be used to determine which topology configuration leads to the optimal performance and/or highest yield for the embedded memory array during a read-operation.

In another implementation, the redundancy in the dual port memory cell 810 read circuitry may be combined with a reconfigurable sense amplifier device 400. Further, the number of sense amplifiers is not limited to just two, and the number of topology configurations and/or configurations bits may increase accordingly. In a further implementation, the control bits and a control circuitry may be combined.

It should be understood by a person of ordinary skill in the art that while the various implementations and accompanying drawings described herein have been with specific reference to sense amplifiers within embedded RAM memory arrays of mixed-signal integrated circuits, they are not limited to such. It should be understood by a person of ordinary skill in the art that various implementations, apparatus, processes and methods described herein are applicable to any integrated circuit, wherein comparable components and/or devices exhibit mismatch that are the result of local and/or global manufacturing variations. Further, it will be understood that these manufacturing variations may be attributed to the lithography process, the fabrication process, the packaging process, and/or any other manufacturing variations known to a person of ordinary skilled in the art. As such, various implementations described herein will be understood to be applicable not only to sense amplifiers within mixed-signal integrated circuits such as memories, but other mixed-signal integrated circuits such as digital to analog converters (DAC), analog to digital converters (ADC), analog integrated circuits, operation amplifiers, an instrumentation amplifiers, timers, voltage and current regulators, filters, sensors, switches, transducers, and/or the like.

The discussion provided herein is directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
   a plurality of integrated circuit devices configured to be arranged in one of a plurality of topology configurations, wherein the topology configurations comprise a parallel configuration and a cross parallel configuration; and
   one or more switches configured to set the plurality of devices into one of the plurality of topological configuration based on one or more control bits.

2. The apparatus of claim 1, wherein the switches comprise one or more pass-gate switches driven by the one or more control bits.

3. The apparatus of claim 2, wherein the one or more pass-gate switches are driven by the one or more control bits in conjunction with one or more combinational logic circuits.

4. The apparatus of claim 1, wherein the control bits are configured to arrange the plurality of integrated circuit devices into a topology configuration having a least amount of offset voltage.

5. The apparatus of claim 1, wherein a total offset voltage for a particular topology configuration comprises an average of individual offset voltages of the plurality of integrated circuit devices used in the particular topology configuration.

* * * * *